United States Patent
Kügler

[11] Patent Number: 5,965,228
[45] Date of Patent: Oct. 12, 1999

[54] INFORMATION CARRIER, METHOD FOR PRODUCING SAME

[75] Inventor: Eduard Kügler, Feldkirch-Tisis, Austria

[73] Assignee: Balzers Aktiengesellschaft, Baizers, Liechtenstein

[21] Appl. No.: 08/674,019

[22] Filed: Jul. 1, 1996

Related U.S. Application Data

[63] Continuation-in-part of application No. 08/593,664, Jan. 29, 1996, abandoned.

[30] Foreign Application Priority Data

Sep. 1, 1995 [CH] Switzerland ............................ 2495/95

[51] Int. Cl.[6] ........................................... B32B 3/00
[52] U.S. Cl. ...................... 428/64.1; 428/64.4; 428/689; 428/698; 428/913; 430/270.11; 430/495.1; 430/945; 369/283; 369/288
[58] Field of Search ................... 428/64.1, 64.2, 428/64.4, 688, 689, 698, 913; 430/270.11, 495.1, 945; 369/283, 288

[56] References Cited

U.S. PATENT DOCUMENTS

| | | |
|---|---|---|
| 3,629,088 | 12/1971 | Frank . |
| 5,348,783 | 9/1994 | Ohno et al. ................................ 428/64 |
| 5,381,401 | 1/1995 | Best et al. . |
| 5,414,678 | 5/1995 | Challener, IV . |
| 5,689,497 | 11/1997 | Wilting et al. ......................... 369/275.1 |

FOREIGN PATENT DOCUMENTS

| | | |
|---|---|---|
| 0086009 | 8/1983 | European Pat. Off. . |
| 0368442 | 5/1990 | European Pat. Off. . |
| 0372517 | 6/1990 | European Pat. Off. . |
| 0388852 | 9/1990 | European Pat. Off. . |
| 0410575A2 | 1/1991 | European Pat. Off. . |
| 0410575A3 | 1/1991 | European Pat. Off. . |
| 0473492 | 3/1992 | European Pat. Off. . |
| 0514211 | 11/1992 | European Pat. Off. . |
| 0658885 | 6/1995 | European Pat. Off. . |
| 0729142 | 8/1996 | European Pat. Off. . |
| 0564789 | 2/1993 | Germany . |
| 0592174 | 4/1994 | Germany . |
| 0658885 | 12/1994 | Germany . |
| 59-003017 | 9/1984 | Japan . |
| 9604650 | 2/1996 | WIPO . |

OTHER PUBLICATIONS

Search Report in CH 26055.
IBM Tech Disclosure no dates available.

*Primary Examiner*—Elizabeth Evans
*Attorney, Agent, or Firm*—Notaro & Michalos P.C.

[57] ABSTRACT

An information carrier has at least two solid material interfaces at which information is, or may be applied and where the information is stored by local modulation of at least one characteristic of the solid material. Reflection of electromagnetic radiation at the interface depends on this characteristic. The information carrier further includes at least one intermediate layer between the two solid material interfaces. The intermediate layer transmits the radiation and is at least predominantly made of either $Si_xC_y$ or $Si_yN_w$, or both.

57 Claims, 4 Drawing Sheets

INFORMATION CARRIER, METHOD FOR PRODUCING SAME

CROSS-REFERENCE TO RELATED APPLICATIONS

The present application is a continuation-in-part of application Ser. No. 08/593,664, now abandoned, filed on Jan. 29, 1996, which is incorporated here by reference, and which is pending.

The present application is accompanied by a copy of U.S. application Ser. No. 08/300,865, abandoned, labeled "Appendix A", which is also incorporated here by reference.

TECHNICAL FIELD

The present invention is generally directed to an information carrier, comprising at least two solid material interfaces, at which information is applied or may be applied by local modulation of at least one solid material characteristic, from which reflection of electromagnetic radiation depends on at said interfaces, and which further comprises at least one intermediate layer between the two solid material interfaces, which layer transmits the said radiation at least to a considerable amount.

As solid material interface we understand the transition area where one material surface is intimately contacted by a second material surface.

The present invention is further generally directed to a method for producing a layer, which at least predominantly consists of $Si_xC_y$ or of $Si_xC_yH_z$ or of $Si_vN_w$ or of $Si_vN_wH_u$ by means of a reactive vacuum coating process, and further is directed to a vacuum coating apparatus which is specifically suited for performing the said method of producing the said layer. The method for producing the said layer is particularly suited for producing at least one layer at the said intermediate layer of the information carrier.

PRIOR ART

In Compact News 1995, "Optical Disc Manufacturing Equipment", so-called high density CDs of different basic principles are shown in general view.

Therefrom, so-called MMCD or "single sided dual layer high density CD" or "hdCD" are known as optical information carrier in the shape of CDs, at which the information density is considerably improved. This is achieved by providing two solid material interfaces, whereat information is stored on a carrier substrate. The solid material interfaces are separated by means of an intermediate layer. The information at the solid material interfaces is applied by local modulation of a surface pattern of intrusions at one of the material surfaces forming the interface. Reading information is realized by means of a beam of electromagnetic radiation in the form of laser light of 635 nm or 650 nm wavelength or especially of 450 nm. The intermediate layer between the information carrying solid material interfaces is practically transmittant to 100% at those wavelengths, so that a part of the impinging beam energy is reflected at the one information carrying solid material interface and a second part at the second.

Further, from the article mentioned above, so-called hybrid MMCD are known, whereat the information provided at respective ones of two information carrying solid material interfaces is selectively read by means of radiation at different wave lengths, namely, on the one hand, by means of a laser beam with a wavelength of light of 635 nm and, on the other hand, with a laser beam with a wavelength of light at 785 nm.

As was mentioned above, the present invention is most generically dealing with such information carriers, method for producing same and apparatus therefor, whereby it must be pointed out that, under this generic aspect, information at the said solid material interfaces may be applied by local modulation of surface structure, as at the well-known optical storage carriers, or may be provided or applied at in the sense of magneto-optical storage as is known from the U.S. Pat. No. 5,158,834. Thus, the present invention, under its most generic aspect, is not limited to information carriers which are already provided with stored information, as e.g. stored by mechanical forming process from a master as known from optical storage disks, but the present invention is also directed to information carriers which are yet empty of information and onto which the information is to be loaded or written.

From the article mentioned above, still further techniques are known for improving information density of CDs. According to one approach, which is known as SD, "super density", two substrates each with one information carrying solid material interface at one side are laid one on the other in back-to-back relation and are linked. The information is read by means of a 650 nm laser beam from either side of the linked carriers. By the fact that, according to one improvement of the SD resulting into so-called "dual layer SD", there is provided, between the information carrying interfaces, an intermediate layer which is transmittant for the light radiation at the wavelength predetermined for reading, the total information becomes readable from one side of the disk. The present invention is also directed to an information carrier of this kind. Thus, information carriers which are the subject of the present invention, may be generically referred to as "bi-or multiple-reflecting" carriers.

It is common to all such information carriers that electromagnetic radiation for writing and/or reading information to or from the two solid material interfaces is, to a first part, reflected from a first solid material interface, the remaining part being transmitted through the intermediate layer and is reflected as impinging on the second solid material interface. It is customary that the intermediate layer comprises at least two layers, one of which being optically effective, especially contributing to reflection, the other of which primarily acting as a spacer.

OBJECTS OF THE INVENTION

The requirement which shall be fulfilled by such an information carrier is primarily that information contained at the said at least two solid material interfaces shall be readable (or writable) substantially equally. Thus, it is an object of the present invention to provide an information carrier of the mentioned type, whereat the said optically effective layer fulfils at least one of the following requirements:

low cost manufacturing;

The reflection at one of the intermediate layer surfaces and a further material concomitantly forming one of the said solid material interfaces shall be as high as possible, but simultaneously also transmission through the said intermediate layer for radiation of predetermined wavelength shall be maximized, i.e. absorption shall be negligible. Thereby, as a further material, a material shall be applicable which is usually used as either carrier substrate material or as spacer layer material or as covering layer material.

The layer shall be applicable at temperatures which are so low that known plastic substrate materials may be layer-coated.

In the UV spectral range the layer shall have a high transmission, too, so that, if a UV hardenable lacquer is applied e.g. as an interface co-forming material or as a material of a spacer layer, UV radiation may be applied through the optically effective layer, so as to harden such a lacquer through the optically effective layer.

The optically effective layer shall further well adhere to common plastic substrate materials as well as to common interface co-forming materials as e.g. to the said lacquer.

The optically effective layer shall further be suited for applications of radiation in the wavelength band of 400 nm to 800 nm, but especially for radiation with a wavelength in the band of 633 nm to 650 nm.

These objects are at least in part achieved by an information carrier which comprises at least two solid material interfaces, at which information is or may be applied and whereat the information is stored by local modulation of at least one solid material characteristic, from which characteristic reflection of electromagnetic radiation depends at said interfaces and which further comprises at least one intermediate layer between the two solid material interfaces, which intermediate layer transmits the radiation and which intermediate layer further comprises a layer which is at least predominantly of $Si_xC_y$ or of $Si_vN_w$.

Further, at least a part of the objects mentioned above are resolved by an information carrier which comprises at least two solid material interfaces, at which information is or may be applied and whereat the information is stored by local modulation of at least one solid material characteristic, from which characteristic reflection of electromagnetic radiation depends at said interfaces, and which further comprises at least one intermediate layer between the two solid material interfaces, which layer transmits the radiation, and wherein further the information which is readable from at least one of the solid material interfaces is readable by means of radiation of predetermined wavelength, whereby the intermediate layer comprises a dielectric layer system with at least one layer, wherein the dielectric layer system has an optical thickness D which, at least in a first approximation, is $m\cdot\lambda_o/4$, wherein m is integer and at least unity and is odd and wherein $\lambda_o$ designates the wavelength of the radiation which is transmitted through the at least one dielectric layer of the dielectric layer system.

Thereby, m may be selected smaller up to 0.6 to its integer value or up to 0.2 larger. Thus, by selecting reduced value of m, and for desired reflection characteristics, a dielectric layer system of significantly reduced thickness may be used, thus significantly improving economic production.

Thereby, preferred dielectric layer materials are $Si_xC_y$, $Si_xC_yH_z$, $Si_vN_w$ or $Si_vN_wH_u$, but also ZrN or even HfN and TiN may be applicable.

When $Si_xC_y$, $Si_xC_yH_z$, $Si_vN_w$ or $Si_vN_wH_u$ materials are used as layer material, it has been found that x/y and respectively v/w should be larger than unity, that preferably $x/y \geq 1.2$ and respectively $v/w \geq 1,2$ and, even better, $x/y \geq 2$, respectively $v/w \geq 1.6$.

Thereby, the intermediate layer at the inventive information carrier allows, due to the reflection controlling characteristics of its material, namely due to refractive index n and to its transmission characteristics (low absorption), to provide even more than two, i.e. three or more information carrying solid material interfaces and to read information therefrom from one side and preferably with one radiation wavelength.

It is a further object of the present invention to provide a method for producing at least one of $Si_xC_y$ and of $Si_vN_w$ and a method for producing at least one of $Si_xC_yH_z$ and of $Si_vN_wH_u$ layers, which layers thus produced are extremely well suited for production of the optically effective layer at the information carriers mentioned above, but which methods may also be used for producing layers for different applications. The inventive methods shall fulfil at least one of the following objects:

economic production, especially as concerns complexity of plants for performing these methods;

accurate and relatively simple process control to realize desired stochiometry characteristics of the layer material;

realization at relatively low temperatures.

It is obvious that these objects, valid for the inventive methods, shall also be valid for the apparatus suited for performing such methods.

At least one of the objects mentioned above is realized by a method for producing a layer which at least predominantly consists of at least one, preferably just one of $Si_xC_y$ and of $Si_vN_wH_u$ by means of a reactive vacuum coating process, which method comprises the step of freeing silicon from a solid body into the process atmosphere and reacting the freed silicon in the process atmosphere with a reactive gas which contains at least one, preferably just one of C and N.

At least one of the objects mentioned above is further resolved by a method for producing a layer, which at least predominantly consists of at least one, preferably just one of $Si_xC_yH_z$ and of $Si_vN_wH_u$ by means of a reactive vacuum coating process, wherein an optimum of transmission of the layer and of refractive index of the material of the layer is achieved by means of adjusting the concentration of a gas in the process atmosphere, which gas contains at least two of C, N and H, preferably just C and H or N and H.

Preferred embodiments of the inventive information carrier, the method for producing layers and the apparatus for doing so will become apparent to the man skilled in this art when reading the following description of the invention as well as when considering the figures and the claims.

DESCRIPTION OF THE PREFERRED EMBODIMENTS

Figure 1:
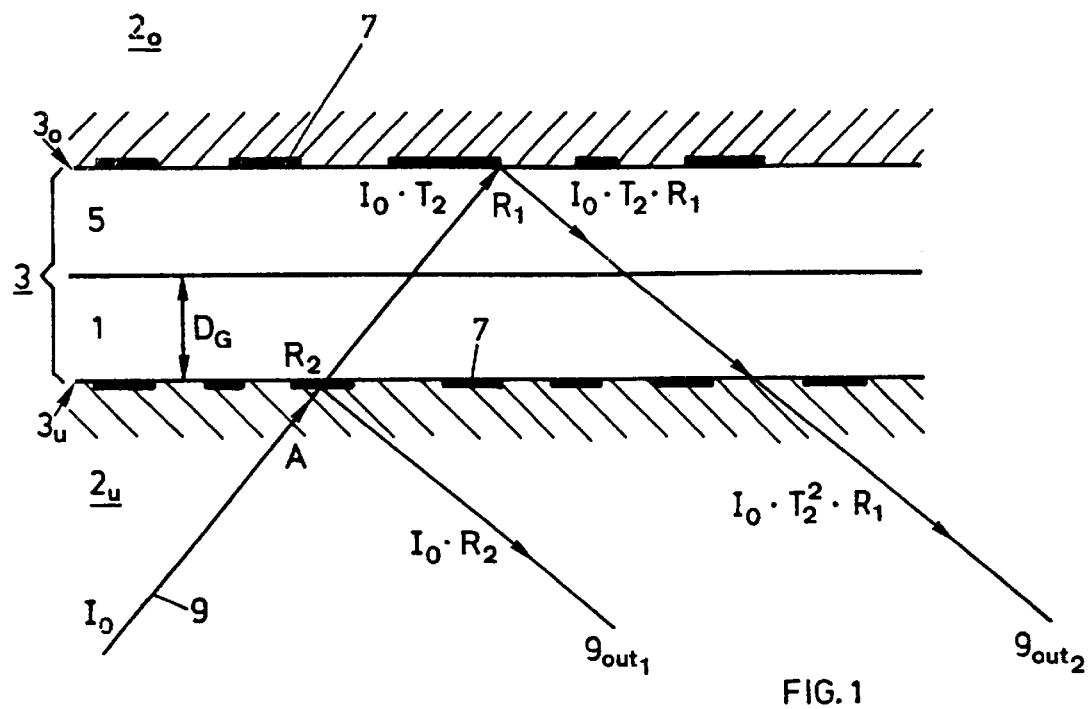
FIG. 1 schematically, an inventive intermediate layer at an inventive information carrier under its generic aspect.

In FIG. 1 there is shown, principally, a section of a one-sided, bi- or multiple-reflecting information carrier according to the invention. An intermediate layer 3 is embedded between adjacent materials $2_o$ and $2_u$. The intermediate layer comprises a dielectric layer 1 and a spacer layer 5. The latter consists preferably of a lacquer, especially of an ultra-violet hardenable lacquer as e.g. of a 2P-lacquer of the firm Philips.

The dielectric layer 1 far preferably consists of at least one of $Si_xC_yH_z$ and $Si_yN_wH_u$, thereby preferably of one of these materials, at least to a predominant amount, but can also at least predominantly consist of $Si_xC_y$ and/or $Si_yN_w$. It could be that even materials such as ZrN or HfN or TiN, and thereby preferably ZrN, may be used as material for the di-electric layer 1.

Thereby, consisting is to be understood in the sense that there can be further components in the layer material, but with a substantially lower amount than the materials just mentioned above.

The material $2_u$ and layer 1 form a solid material interface $3_u$. The material $2_o$ and the spacer layer 5 form a second solid material interface $3_o$. At these two interfaces an informative structure is applied or may be applied by local modulation of surface characteristics, as e.g. for optical information carriers, of the geometric structure and, for magneto-optical carriers, of the magnetic characteristics.

The informative structure is shown in FIG. 1 principally by means of areas 7. The modulated solid body characteristics, i.e. for instance the said geometrical surface structure or magnetic surface structure, modulate impinging electromagnetic radiation 9, as such radiation is shifted along the solid material interfaces $3_o$ and $3_u$, as is perfectly known to the man skilled in this art.

The electromagnetic radiation 9 with an intensity $I_o$ is, on one hand, reflected at the first solid material interface $3_u$, according to a reflected part $I_o \cdot R_2$, wherein $R_2$ is the factor of reflectance. On the other hand, the part $I_o \cdot (1-R_2-A_2) = I_o \cdot T_2$ transits through the layer 3, wherein $A_2$ is the absorption at the layer and $T_2$ is the transmission through the layer. This part $I_o \cdot T_2$ transits practically without loss through layer 5 and is reflected according to factor $R_1$ to become $I_o \cdot R_1 \cdot T_2$. After having passed through layers 5 and 1 again, the radiation becomes $I_1 = I_o \cdot T_2^2 \cdot R_1$. It is to be noted that the transmission $T_2$ enters as a quadratic term $T_2^2$ into the expression for $I_1$.

The energy partitions, as explained and as shown in FIG. 1, are approximations which do not take account of the negligible influence of the optically inactive spacer layer 5. With respect to the complicated higher order approximations of these energy considerations, we refer to "Optical Recording", Alan B. Marchant, Addison-Wesley, 1990, Publishing Company, chapter 13, pages 344–353. The accurate distribution may be calculated with the help of the program "Film*STAR", Optical Thin Film Software, FTG Software Associates, P.O. Box 579, Princeton, N.J. 08542.

Required are two reflected beams $9_{out1}$ and $9_{out2}$ which are of an energy which is as equal as possible.

It is known to provide at the intermediate layer 3 a metal or metal-similar layer, as e.g. of Au, whereat, besides of the transmission $T_2$, the reflection, too, very critically varies as a function of the geometric thickness $D_G$ of the layer and which is expensive in production.

As was mentioned, in a far preferred embodiment of the inventive information carrier, the inventively applied layer 1 consists, at least predominantly, of $Si_xC_y$, $Si_xC_yH_z$, $Si_yN_w$ or $Si_yN_wH_u$. The Layer 1 thereby consists preferably of predominantly one of these materials; nevertheless, at least two of these four materials might be mixed.

The following preferred values and ratios for x, y, z and v, w, u were found:
1. It is clearly preferred that
   1.1 $x \geq y$ and respectively $v \geq w$, irrespective of z and u.
   1.1.1 Thereby it is further preferred that
   $x \geq 1.2y$ and respectively $v \geq 1.2w$
   and even more preferred
   $x \geq 2y$ and respectively $v \geq 1.6w$, irrespective of z and u.
   This is valid for material of predominantly one of the four mentioned compounds, but would also hold for material composed of two, three or four of these compounds.
   Further there is thereby preferred:
2. $x \leq 0.8$, $y \geq 0.05$ and $z \geq 0.1$,
   thereby especially
   $x \leq 0.52$, $y \geq 0.1$ and $z \geq 0.2$,
   $v \leq 0.8$, $w \geq 0.05$, preferably $w \geq 0.1$.
3. The following ratios are considered preferable:
   3.1 $[0.445:0.262] \leq [x:y] \leq [0.775:0.078]$,
      irrespective of the value of z and whether a single compound or multiple compound material is provided.
   3.2 $[0.445:0.249] \leq [x:z] \leq [0.775:0.118]$,
      irrespective of the value of y and whether a single compound or multiple compound material is provided.
   3.3 $[0.078:0.249] \leq [y:z] \leq [0.262:0.118]$,
      irrespective of the value of x and whether a single compound or multiple compound material is provided.
   3.4 In fact, it has been found that highest index of refraction of the material $Si_xC_yH_z$ is reached if
      $x:y:z = 0.704 (\pm10\%):0.087 (\pm10\%):0.131 (\pm10\%)$,
      is realized, ±10% indicating measuring accuracy and thus statistic dispersion of multiple measurement.
      For lowest index of refraction still applicable, it has been found:
      $x:y:z = 0.494 (\pm10\%):0.238 (\pm10\%):0.226 (\pm10\%)$.
   3.5 $[0.527:0.401] \leq [v:w] \leq [0.858:0.099]$,
      irrespective of the value of u and whether a single compound or multiple compound material is provided.
   3.6 $[0.527:0.044] \leq [v:u] \leq [0.858:0.009]$,
      irrespective of the value of w and whether a single compound or multiple compound material is provided.
   3.7 $[0.099:0.044] \leq [w:u] \leq [0.401:0.009]$,
      irrespective of the value of v and whether a single compound or multiple compound material is provided.
   3.8 In fact, it has been found that highest index of refraction of the material $Si_yN_w$ is reached if
      $v:w = 0.78 (\pm10\%):0.11 (\pm10\%)$,
      irrespective of u. ±10% indicates statistic dispersion of multiple measurements.
      For lowest index of refraction still applicable, it has been found:
      $v:w = 0.586 (\pm10\%):0.364 (\pm10\%)$,
      irrespective of u.

This is especially valid if, as electromagnetic radiation 9, light at a wavelength $\lambda_S$ is used for which there is valid:

$$400 \text{ nm} \leq \lambda_s \leq 800 \text{ nm},$$

and wherein there is especially preferably valid:

$$630 \text{ nm} \leq \lambda_s \leq 655 \text{ nm}.$$

In opposition to well-known applications of metallic layers for realizing the layer 1, the inventively provided layer 1, especially preferably of $Si_xC_y$ and/or $Si_yN_w$ or even more preferred of $Si_xC_yH_z$ and/or $Si_yN_wH_u$, makes use of interference, in that there is valid for the optical thickness D of layer 1:

$$D = m \cdot \lambda_o / 4,$$

wherein m is an uneven integer of at least unity, but may be reduced by an amount of up to 0,6 or increased by an amount of up to 0.2. $\lambda_o$ is the optical wavelength of the radiation 9 in the intermediate layer material, i.e. especially in the material of layer 1.

Thereby, reflection $R_2$ becomes significantly less critical with respect to the geometric thickness $$D_G = \frac{m}{n} \cdot \lambda_o / 4$$

(n: index of refraction)

as the optical thickness $$D = m \cdot \lambda_o / 4$$

may vary according to a reduction of m by a value up to 0.6 or an increase of m by a value up to 0.2.

Thus, $D_G$ may be selected considerably smaller (thickness of layer!) than according to integer-valued m, whereby reflection is only unsignificantly reduced, transmission is significantly increased.

The possibility of providing the layer with reduced thickness ($D_G$) further significantly increases economic production (increased feed-through).

The fact that generically the reflection is uncritical with respect to $D_G$ further significantly lowers efforts for thickness control in layer production.

As the transmission $T_2$ appears quadratic at beam $9_{out2}$ (see FIG. 1), increase of $T_2$ largely improves the energy ratio at the beam $9_{out2}$ and $9_{out2}$ to become equal. As was said, the transmission $T_2$ appears quadratic in the energy output at beam $9_{out2}$. Thus, already a small reduction of geometric thickness leads to a significant improvement at this beam.

Further, the reflection homogenity or distribution along solid material interface $3_o$ becomes significantly less dependent on thickness distribution or thickness variations of $D_G$ of the layer 1 on the material $2_u$, which is with respect to the production method for depositing layer 1 a significant advantage.

The spacer layer 5, especiallyy for optical information carriers, is preferably formed by a lacquer which may be surface structured, as e.g. by a lacquer "2P" of the firm Philips, i.e. by a lacquer which may be hardened by ultra-violet radiation ($\lambda_s < 400$ nm).

The inventive layer 1 has intrinsically a high transmission (low absorption) in the ultra-violet range, which may even be improved by the possibility mentioned above, namely to reduce the geometric thickness $D_G$ of layer 1 without significantly affecting reflection. Thereby, a transmission for ultraviolet range radiation is reached, which is at least 10%. The intermediate layer 3, especially at optical information carriers, is commonly deposited on a plastic material, as material $2_u$, especially on surface structured polycarbonate or PMMA.

A significant advantage of the inventive layer 1 may be seen in the fact that the preferred layer materials $Si_xC_y$ and $Si_xC_yH_z$ as well as the said plastic substrate materials and the said lacquer contain carbon, so that rigid adherence of the layer material is achieved with respect to the said plastic material or lacquer.

So as to realize a reflection $R_2$ of 30±10% between common substrate plastic materials, such as polycarbonate or PMMA, and the material of layer 1, a very high index of refraction $n_1$ is required for the layer material, because the index of refraction of the substrate material is already high: The index of refraction of polycarbonate is e.g. 1.57. If, on the other hand, at the inventively applied material of layer 1 the index of refraction $n_1$ is increased, this will simultaneously lead to a decrease of transmission $T_2$, i.e. to an increase of absorption in the material of layer 1. The output signal from solid material interface $3_o$, according to FIG. 1, is very critically dependent on a decrease of transmission $T_2$ (increase of absorption). By tailoring stochiometry x/y and especially x/y/z, as was described above, it becomes possible to reach an optimum compromise of the contradictory requirements with respect to index of refraction and to transmission. Especially at the far preferred layer material $Si_xC_yH_z$ it becomes possible by varying two independent parameters, namely carbon content y and hydrogene content z, to optimally set the per se contradictory requirements. A preferred technique to realize such a setting shall be described later in context with the description of the inventive method for producing the layers.

With application of the inventive layer 1 of $Si_xC_y$, $Si_xC_yH_z$, $Si_yN_w$ or $Si_yN_wH_u$, it became possible to realize reflections $R_2$ for light at $\lambda_s = 635$ nm at polycarbonate as material $2_u$ of between 20% and 40%. This led to energy transmitted into the intermediate layer 3 of between 60% and 80%, such energy impinging on the second solid material interface $3_o$, taking into account an absorption $A_2$ at the said wavelength $\lambda_s$ of practically 0%. Reflection $R_1$ is optimized by appropriate selection of the material $2_o$ according to FIG. 1, and was, e.g. using Al as material $2_o$, 81% of the energy impinging on the second solid material interface. Thus, and according to FIG. 1, for a beam $9_{out1}$ of 20%, there resulted approximately a beam $9_{out2}$ of 52%, and for a beam $9_{out1}$ of 40% there resulted approximately a beam $9_{out2}$ of 29% of the impinging energy.

With a high degree of probability, the inventive intermediate layer 3 with the inventive layer 1 may also be used for radiation within the blue spectral range, i.e. for light wavelength according to 400 nm $\leq \lambda_s \leq$ 500 nm. Further, and in the sense of the hybrid MMCD described above, the inventive intermediate layer and layer may be used for applying radiation with selectively different wavelengths, as e.g. of 635 nm and 785 nm, for selectively reading information at one interface by light of one wavelength, and from the second interface by the light of the second wavelength. Thereby, and with an eye on FIG. 1, if e.g. 635 nm light is used to read information from interface $3_u$ and light of 785 nm is used to read information from interface $3_o$, then the optically effective layer 1 is tailored so that practically all 635 nm light is reflected at $R_2$ and practically all 785 nm light is transmitted onto solid material interface $3_o$ and is reflected there. This is achieved by making the geometric thickness $D_G$ of layer 1 so as to accord with an odd number of quarter wavelengths with respect to the 635 nm light, and simultaneously to accord with an even number of quarter wavelengths for the 785 nm light.

As was mentioned above for an odd number of quarter wavelengths, m is

| $0.4 \leq m \leq 1.2$; | $2.4 \leq m \leq 3.2$; |
|---|---|
| (first order) | (third order) |
| $4.4 \leq m \leq 5.2$; | ... |
| (5th order) | |

With respect to polycarbonate and most probably with respect to PMMA on one hand as well as most probably with respect to the UV-hardenable lacquers, the inventive layer 1 fulfills, with respect to adherence, the adherence tape tests according to MIL-M-13508C and/or MIL-C-00675B, as defined in H. Pulker, "Coatings on Glass", p. 358, Elsevier, 1984.

Figure 2:
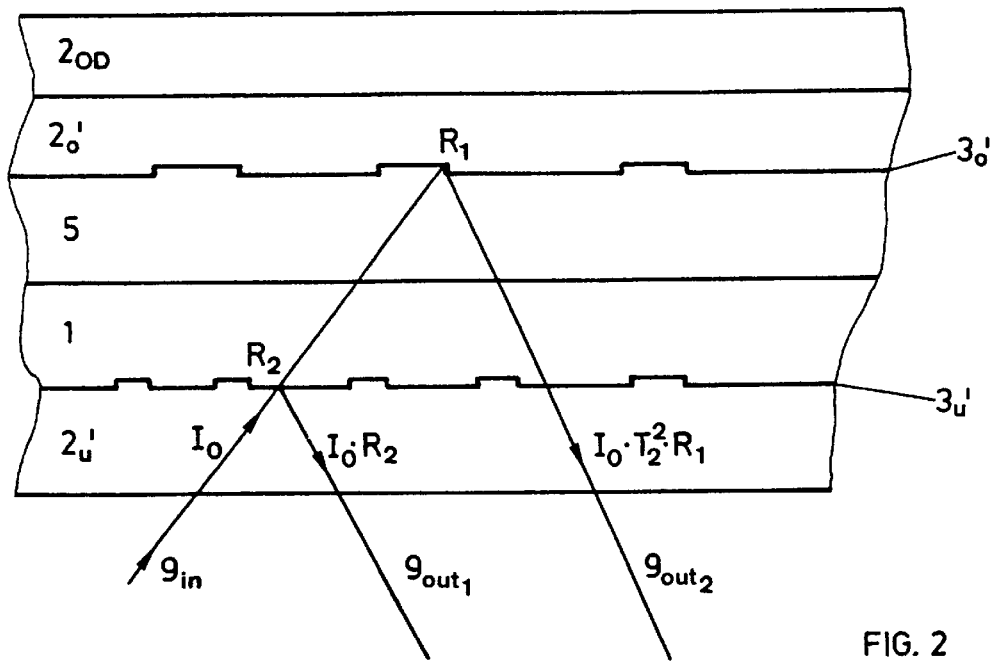
FIG. 2 schematically, a section of an inventive optical information carrier with two information-carrying solid material interfaces.

FIG. 2 shows a preferred embodiment of an inventive optical information carrier, realized by an optical storage disk with two information carrying solid material interfaces $3_o'$, $3_u'$, On a substrate carrier $2_u'$, preferably made of polycarbonate or PMMA, a layer 1 is deposited according to the preferred specification under 1) to 3.8).

On the spacer layer 5 there is provided a metallic reflection layer $2_o'$ made of $A_U$ or Ag, thereby preferably made of Al. The highly reflective layer $2_o'$ is covered with a covering layer $2_{oD}$.

Figure 3:
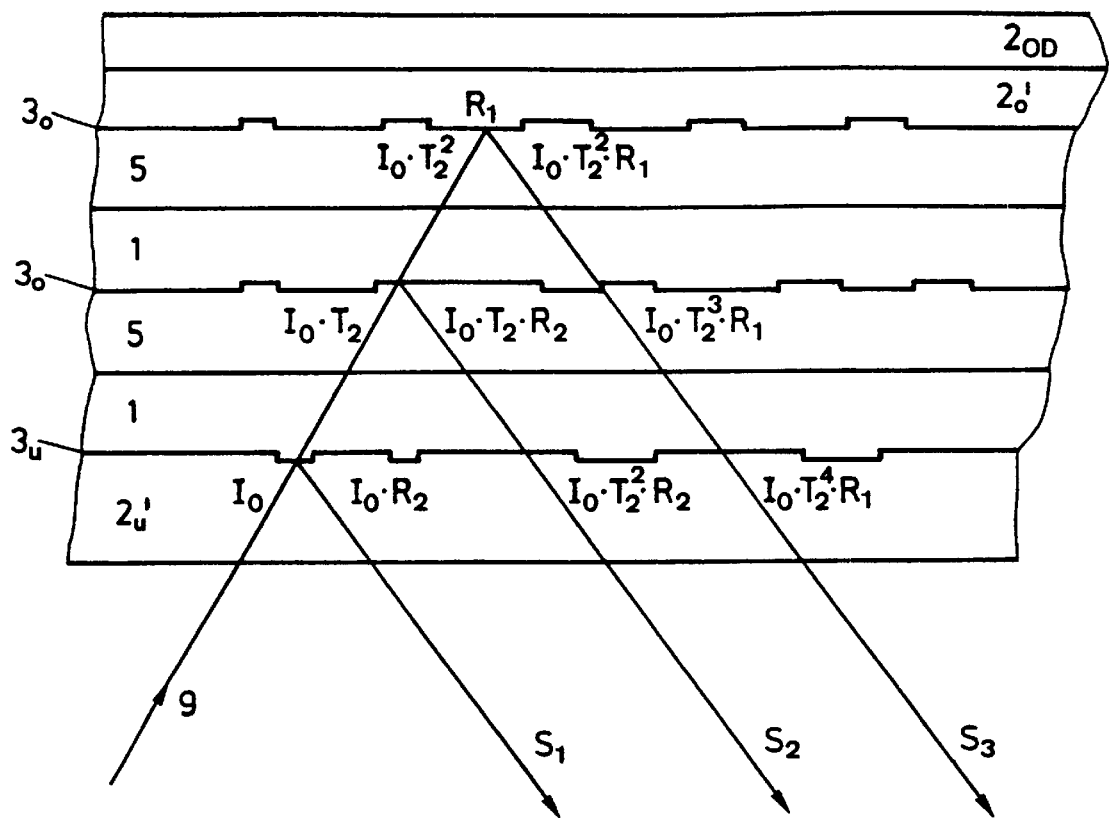
FIG. 3 in a representation according to FIG. 2, a section of an inventive information carrier with three information-carrying, solid material interfaces.

At a further embodiment shown in FIG. 3, the following layers are provided:

carrier substrate $2_u'$ preferably made of polycarbonate or PMMA;

layer 1 preferably made of the materials mentioned above, namely $Si_xC_yH_z$, $Si_xC_y$, $Si_vN_wH_u$ or $Si_vN_w$;

spacer layer 5 preferably made of ultra-violet hardenable lacquer, thereby preferably of a "2P" lacquer which defines the second solid material interface $3_{o1}$ with respect to a further inventive layer made preferably of $Si_xC_yH_z$, $Si_xC_y$, $Si_vN_wH_u$ or $Si_vN_w$;

spacer layer 5 preferably made of ultra-violet hardenable lacquer which forms the third solid material interface $3_{o2}$ with respect to a highly reflective metal, especially aluminum Layer $2_o'$.

From each of the three solid material interfaces $3_u$, $3_{o1}$, $3_{o2}$, there is, preferably again at a laser light wavelength of 635 nm, reflected so much that each of the output beams Si to $S_3$ are of approximately 20% of the impinging energy I. The absorption of every "semi-transparent" inventive layer 1 is smaller than 2%, and the respective transmission $T_2$ is accordingly high.

The embodiment according to FIG. 3 applied to the predescribed MMCD technique results in a storage capacity per one side of a 120 mm CD of approximately 11 GByte, whereas e.g. at a SD (super density disk) there results a storage capacity per side of approximately 13 GByte and for a double-sided SD of approximately 27 GByte.

In the following, the inventive method for producing especially the described layers 1 shall be described with the help of inventive reactive layer vacuum deposition apparatus, which latter may not just exclusively be used for the above mentioned "semi-transparent" layers 1 at the inventive information carrier, but which are especially suited for that object.

Figure 4:
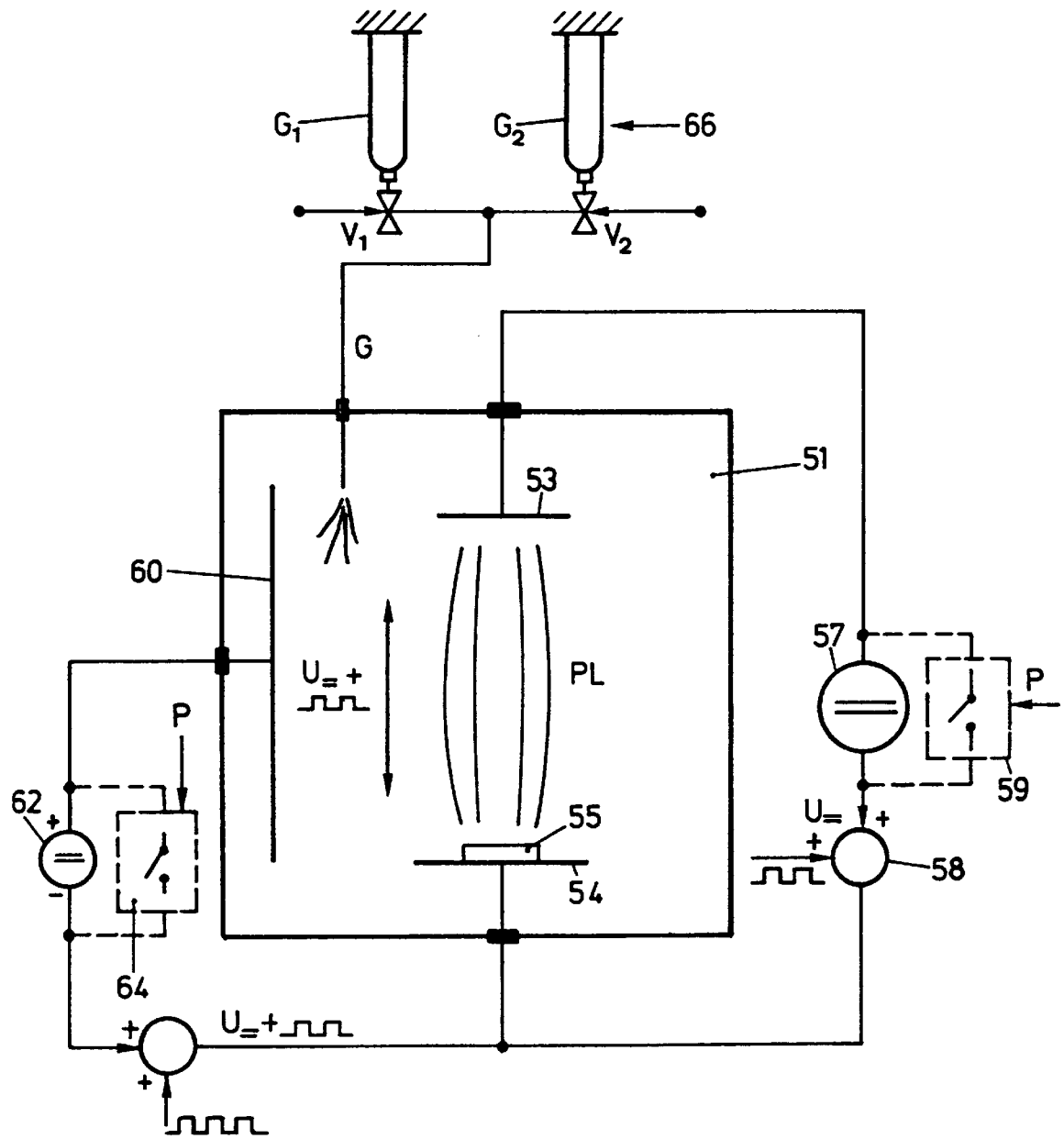
FIG. 4 schematically, a first inventive apparatus for producing layers and for realizing the inventive methods for producing such layers.
Figure 5:
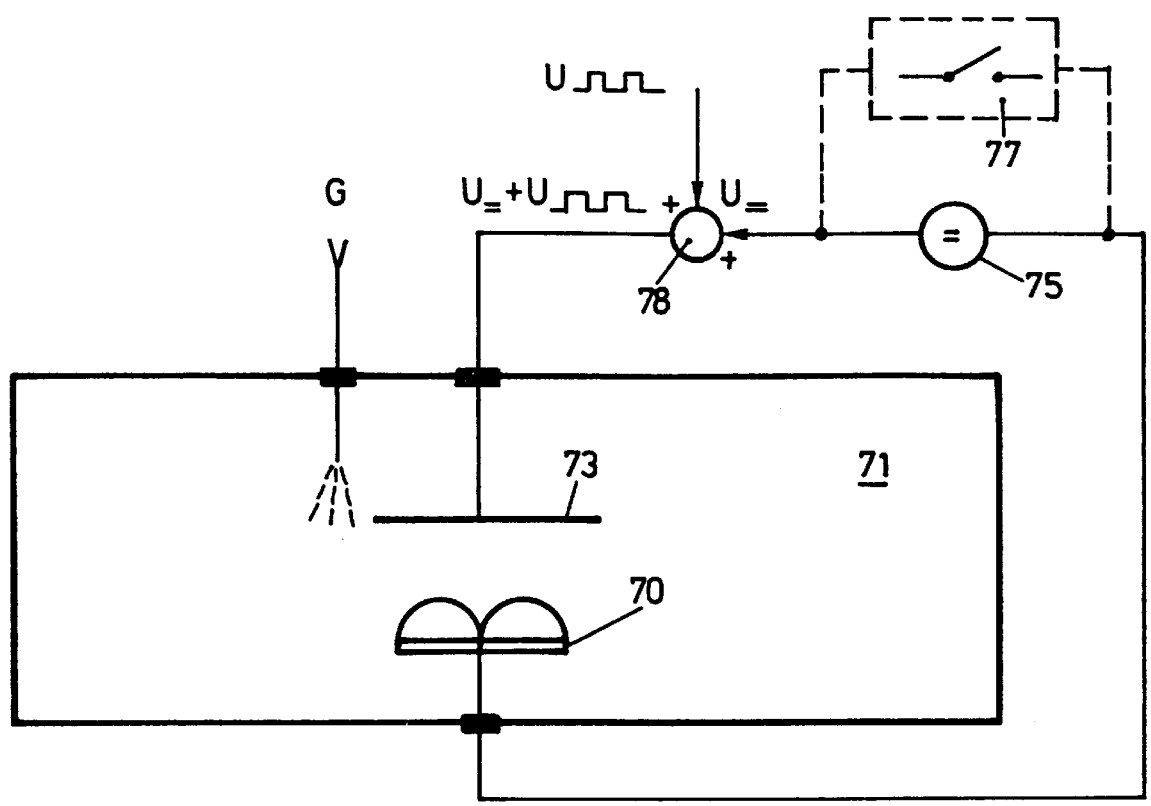
FIG. 5 schematically, a second and preferred embodiment of an inventive apparatus for realizing either of the inventive methods and with an inventive target.

At the apparatus schematically shown in FIG. 4, the "semi-transparent" layer 1 (FIGS. 1 to 3) is deposited by means of ion plating, whereas in a preferred apparatus, according to FIG. 5, and in a preferred manner, the inventive layer 1 is deposited by means of reactive sputter coating.

With the inventive methods of producing such layers—other methods appear possible, too—, as one most important aspect, the relation of transmission $T_2$ and index of refraction $n_1$ at the preferably deposited $Si_xC_yH_z$ and/or $Si_vN_wH_u$ layer is optimized by controlling the ratio of carbon to hydrogene. This is preferably realized by feeding at least two gases to the process atmosphere, which gases have different C/H or N/H content ratios each. Thereby, the content of these two gases in the process atmosphere may be open-loop controlled or negative feedback controlled. A second alternative or additional aspect is that silicon atoms are freed into the process atmosphere from a highly pure silicon solid body and react in the process atmosphere with carbon-, preferably with carbon- and hydrogene-containing gas. Under the first aspect, i.e. by controlling the amount of the said two gases in the process atmosphere, the optical parameters are optimized. By the second, a most economic and well controllable process is realized.

As a process discharge gas, preferably a noble gas as e.g. Ar, is used.

As reactive gases, carbon hydrogene gases, as e.g. Butane $C_4H_{10}$, Methane $CH_4$, Propane $C_3H_8$, Nitrogen $N_2$ or Nitrogen-hydrogen gases may be used, whereby, by open-loop or negative feedback loop controlling each gas flow to the process atmosphere, more or less carbon C or nitrogen N is introduced per time unit compared with hydrogene fed to the process chamber per time unit.

The silicon, freed from the silicon solid body source, allows use of low price solid body sources compared, e.g., with the case where SiC is freed from well-known graphite-doped silicon sources. By means of accurately predetermining the composition of the silicon of the solid body source, the overall layer deposition process becomes more controllable and, by varying process gas composition, adjustable.

According to FIG. 4, which shows schematically an ion plating apparatus, a plasma discharge PL in a vacuum chamber 51, between electrodes 53 and 54, is maintained. By means of the discharge PL, silicon of a target 55, as shown at the electrode 54, is evaporated or sputtered into the process atmosphere. Instead (not shown) of a plasma discharge PL, there may also be used, and as known to the skilled expert, thermic evaporation of silicon, as e.g. by means of electron beam.

The plasma discharge PL may be operated either with Rf-voltage or with DC or with DC and superimposed Rf or with DC with superimposed medium frequency Mf-energy or with DC with superimposed low frequency Lf-signal, whereby, preferably, DC is used with superimposed Mf or Lf pulsating voltage.

It must be considered that the layer material produced in the process atmosphere as well as silicon per se are poorly electrically conducting, so that, with an eye on arcing and source poisoning by isolating layers, much care must be taken for appropriate process control.

In a far preferred embodiment as shown, the plasma discharge PL is operated by means of a DC source 57. Stability of the coating process is maintained in spite of the use of a low cost DC source 57, by superimposing to the output signal of the DC source $U_=$, an AC voltage with a frequency in the medium or low frequency range, which is preferably a pulsating voltage. As schematically shown, this AC voltage is preferably intermittently superimposed at a superposition unit 58 to the output DC signal of source 57. Such signal superposition is preferably realized by interconnecting the two discharge electrodes 53 and 54 intermittently by means of the chopper unit 59, which intermittently interconnects these electrodes alternatively high ohmically and low ohmically. This preferred technique is shown in broken lines. Either a predetermined fixed chopper repetition rate and/or duty cycle is used or, and preferably, the occurrence of disturbance arcing is automatically monitored in the process recipient and controls via chopper unit 59 low ohmic connection of the two discharge electrodes 53 and 54, thereby preventing arcing.

This superposition technique is described completely and in detail in the European application no. 0 564 789 which accords with the U.S. application Ser. No. 08/020,672 or 08/300,865 and to the Japanese application no. 5-65052.

With respect to this preferably used choppering technique, the said patents and applications shall be considered as integrated part of the present description; the U.S. application Ser. No. 08/300,865 is enclosed to this specification as an appendix A.

In the vacuum chamber 51, there is further provided a workpiece carrier electrode 60, which, e.g. with respect to electrode 54, is fed with a negative DC electric potential by means of a DC source 62. Here, too, a superposition unit, as was described, realized preferably by means of a chopper unit 64, according to the predescribed chopper unit 59, allows to maintain stability of the layer deposition process at the workpiece carrier electrode 60. With respect to electric potential, which is applied to the housing of the chamber, the electrodes 53, 54 and 60, the skilled expert knows different possibilities, also with respect to defining and applying reference, i.e. ground potential.

Inventively, a gas tank arrangement 66 is provided, from which a reactive gas G containing carbon C and/or nitrogen $N_2$ and preferably further hydrogene H is fed to the chamber 51, i.e. into the process atmosphere. This besides a plasma discharge working gas, which is normally selected to be Ar. Preferably, the gas G results from controlled mixing of two gases $G_1$ and $G_2$, as schematically shown, by means of controllable valves $V_1$ and $V_2$. If the two gases, as e.g. Propane and Butane or Nitrogen and Ammonia, have different stochiometric ratios (e.g. Butane 2.5; Propane 2.7), the control of varying contents of the gases $G_1/G_2$ in the process atmosphere controls the ratio of C/H or respectively of N/H in that atmosphere, and thus at the $Si_xC_yH_z$ or $Si_vN_wH_u$ layer which is growing. Thus, by means of two independent parameters, namely the C and H or N and H content, the transmission $T_2$ and the index of refraction $n_1$ at the growing $Si_xC_yH_z$ or $Si_vN_wH_u$ layer is controlled.

If only one gas is used as a reactive gas, preferably Propane is used for $Si_xC_yH_z$ and Nitrogen for $Si_vN_w$.

Today, layer deposition is preferably realized by magnetron sputtering. FIG. 5 schematically shows, as an example, an apparatus for such magnetron sputtering. From the magnetron source 70, silicon is freed into the process atmosphere of the vacuum recipient 71. The magnetron electrode 70 is connected to a workpiece carrier electrode 73 via a DC source 75, as was described, whereby, again, a chopper arrangement 77 of the kind which was mentioned above is used (shown in dashed lines). This is a preferred realization of superimposing an AC voltage to the output DC voltage of the DC source 75 at the superposition unit 78. Thereby, again, the AC voltage is preferably selected as a medium frequency or low frequency signal, and is preferably pulsating.

In the operating mode with a DC-driven plasma discharge PL at ion plating according to FIG. 4 and especially for DC operated sputtering according to FIG. 5, an inventive silicon target is preferably used, which is negatively or positively doped, preferably with Boron and/or Phosphor. Thereby, preferably the specific resistance of the target material made of doped silicon, $\rho_{Si}$, is:

$$0{,}01 \Omega cm \leq \rho_{Si} \leq 0.6 \Omega cm.$$

Thereby, in a preferred mode, the following is valid:

$$0{,}4 \Omega cm \leq \rho_{Si} \leq 0{,}6 \Omega cm.$$

By this it is achieved that the per se low conductive silicon has an increased conductance $\rho_{Si}^{-1}$ and may be even DC sputtered or, as was explained, preferably sputtered by means of a DC voltage with superimposed AC component. Thereby, as we described, parallel chopper technique is preferably used.

This mode of operation allows a most economic operation at a high deposition rate, whereby the silicon allows further to reach a high layer quality due to the fact that it is sputtered without arcing and without occurrence of droplet.

The reactive gas G is applied as a single gas or as a gas mixture, as was explained with respect to FIG. 4. The layers may be deposited with a magnetron source 70, as known per se, so e.g. by placing the carrier substrates just in front of the target. The carrier substrate may also be moved along the target, so e.g. in linear in-line coaters, or may be rotated passing the target, as e.g. in plants with rotating cylindrical workpiece carriers.

Before results are presented, the advantages of the inventive information carriers and of the inventive method of producing layers and thus of apparatus suited to perform such methods shall be listed in summarized form:

With respect to the information carrier with inventive intermediate layer:

At a selected wavelength (preferably 635 nm) of the electromagnetic radiation for applying and especially for reading information from the solid material interfaces, between which at least one inventive intermediate layer with layer 1 is situated, a high transmission $T_2$ of the intermediate layer is reached, and a high reflection at a surface of the intermediate layer (FIGS. 1 to 3).

The transmission $T_2$ of the inventively provided layer 1 is high for ultra-violet light ($\geq 10\%$), so that lacquers, which are applied and which are ultra-violet hardenable, may be hardened by ultra-violet radiation transmitted through the layer 1 with a high effectiveness.

Adherence of the layer 1 with respect to covering materials which comprise C, as especially with respect to plastic materials, thereby especially to polycarbonate or PMMA, and with respect to the ultra-violet hardenable lacquers as mentioned is high, because the material of the inventive layer also comprises the element C.

By deposition of the layer 1 with an optical thickness, which substantially accords with an uneven number of quarter wavelength with respect to the wavelength of the radiation considered, the reflection becomes less critical with respect to the exact geometric thickness of the intermediate layer, and additionally it becomes possible to increase transmission of that layer by depositing layer 1 with reduced thickness (m−0.6) than is defined by the uneven integer number m of $\lambda_o/4$ optical thickness.

Especially with using $Si_xC_yH_z$ or $Si_vN_wH_u$ layer material for layer 1, i.e. with C and H or with N and H, two independent parameters for tailoring transmission and reflection of the layer 1 and the intermediate layer respectively are exploitable.

The inventive intermediate layer with the layer 1 opens the possibility of economic, easily controllable manufacturing processes and of their realization by means of low cost apparatus.

With respect to the method of producing layers:

The use especially of doped silicon targets is economic and simple, the according targets are easily manufacturable.

By applying gases which contain carbon, hydrogen or Nitrogen, relatively low cost and safe gases are used.

By the use of a DC coating technique with the AC superposition which was described, expensive high power AC generators become obsolete. Arcing and other process instabilities are nevertheless accurately avoided, although low cost and technically simple generators are used.

1. EXAMPLE

An $Si_xC_yH_z$ layer was deposited on a polycarbonate substrate. Thereby, an apparatus was used as principally shown in FIG. 5. The substrates were deposited on a cylindric carrier and were rotated passing a rectangular magnetron source. Thereby, the minimum distance between substrates and target surface was 70 mm.

| Target material: | Si (99.99%), p-doped with Boron, $\rho_{Si}$ = 0.5 Ωcm; |
| --- | --- |
| Discharge current feed: | 10 kW/DC with chopper unit according to 77 of FIG. 5; |
| Discharge operating gas: | Ar; |
| Reactive gas: | Propane, $C_3H_8$; |
| Reactive mode/ metallic mode: | Negative feedback control by monitoring the deposition process with the help of a plasma emission monitor and adjusting chopper unit 77 as well as the flow of Argon and Propane by means of adjustable controllers according to $V_1/V_2$ of FIG. 4; |
| Discharge power: | 7 kW; |
| Rotational frequency of workpiece carrier 73: | 0.5 Hz. |

In the following table, three batches no. 2, 3 and 4 are specified with respect to coating process parameters.

| Batch | Power kW | Argon flow sccm | Gas pressure ∈-3mbar | Metallic mode voltage UMM V | Reactive mode voltage URM V | Propane flow $qC_3H_8$ sccm | Flow ratio $qC_3H_8$:qAR | Sputtering time s |
| --- | --- | --- | --- | --- | --- | --- | --- | --- |
| 2 | 7 | 25.5 | 4 | 807 | 777–780 | 5.9 | 23.14% | 377 |
| 3 | 7 | 25.5 | 4 | 800 | 724 | 12 | 47.06% | 377 |
| 4 | 7 | 25.5 | 4 | 828 | 765 | 11.4 | 44.71% | 225 |

At the batches no. 2, 3 and 4, the following values were measured:

| Batch | Index of refraction at 635 nm n | Extinction coefficient k at 635 nm k | Reflection at 635 nm % |
| --- | --- | --- | --- |
| 2 | 3.19 | 1.47 | 38 |
| 3 | 2.28 | 0.35 | 13 |
| 4 | 2.59 | 0.67 | 23 |

By the inventive $Si_xC_yH_z$ coatings applied to polycarbonate substrates, at batch no. 4 a reflection of 40% was measured at a wavelength of 635 nm and from the layer-to-air-side. The amount of transmitted light through the polycarbonate carrier substrate with a thickness of 1.2 mm and with the inventive layer thereon was 60% at the wavelength of 635 nm, which accords with the transmission $T_2$ of practically a 100%, i.e. to an absorption of practically 0%, which is thus neglectable. The amount of transmitted energy at a wavelength of 360 nm was still 12%. At the batches no. 2 to 4, as specified above, the following stochiometry was achieved:

| Batch No. | Si | C | H | O |
| --- | --- | --- | --- | --- |
| 2 | 0.529 | 0.116 | 0.295 | 0.06 |
| 3 | 0.401 | 0.227 | 0.29 | 0.082 |
| 4 | 0.42 | 0.203 | 0.33 | 0.047 |

There resulted, with an eye on FIG. 1, $$0.2 \leq R_2 \leq 0.4 \text{ and}$$

$$0.2 \leq (R_1 \cdot T_2^2) \leq 0.4.$$

As band for the index of refraction, we first propose: $2.59 \leq n_1 \leq 3.2$ for polycarbonate substrate material.

For the index of refraction k, we first propose the following values:

$$k_{300\ nm} \leq 1.5 \text{ and}$$

and/or $k_{600-700\ nm} \leq 0.5$, especially $k_{600-700\ nm} \leq 0.1$, and/or $k_{450-500\ nm} \leq 1$.

By the realization of an information carrier structure according to FIG. 3 with the deposition processes as disclosed above, the beams $S_1$ to $S_3$ had about 20% of impinging energy at an absorption of 2% at most for light at the wavelength of $\lambda_s$=635 nm.

2. EXAMPLE

As a result of the first example mentioned above, we noted that with stoichiometric or nearly stoichiometric semi-transparent layers made of SiC, we reached index of refraction $n_1$, not really exceeding the value of 3.2 at a wavelength of 633 nm. On the other hand, it first seemed impossible to use a more accentuated unstoichiometry and thus higher index of refraction because of the large k-value which were supposed to occur. It further seemed impossible to reach a signal spex of 25% for the blue laser at 450 nm wavelength.

Nevertheless, the inventors went on with further experiments that showed that higher index materials would allow to use thinner layers, so that, even with increased k-value materials, the transparency decrease would not be detrimental. Thus, and as will be shown in this example, index of refraction well above 4, up to 4.6 and specifically at 4.2, were reached with k-values $k_{350\ nm} \leq 2.5$, $k_{600-700\ nm} \leq 0.5$ and $k_{450-500\ nm} \leq 1$.

Using Si as target material, high index of refraction layers were realized by reactive sputtering in nitrogen instead of hydrogenic carbon gas according to example 1. Even experimenting on a more stoichiometric version of $Si_xC_yH_z$ showed that it is possible to reach, even at 450 nm, 25% signals from both information layers.

$Si_xC_yH_z$, $Si_xC_y$, $Si_vN_wH_u$ and $Si_vN_w$ layers were deposited on polycarbonate substrates. Although an apparatus as shown in FIG. 5 could be used, an SDS 100 apparatus of Balzers was used where the substrate is kept stationary with respect to the target.

| Substrate-to-target distance: | 40 mm |
|---|---|
| Approximate reaction volume: | 5000 cm$^3$ |
| Target material: | as in example 1. |
| Discharge current fee: | as in example 1. |
| Discharge operating gas: | as in example 1. |
| Reactive gases: | Methane for $Si_xC_y$ and $Si_xC_yH_z$. |
| Nitrogen and ammonia for: | $Si_vN_w$ and $Si_vN_wH_u$. |
| Discharge power: | 4 kW. |

In the following table, four typical batches with highest index of refraction reached and lowest index of refraction reached and still applicable are specified with respect to coating parameters, indicating the preferred range for digital-video disk coatings made of silicon carbides or silicon nitrides.

TABLE 1

Process parameters and resulting n and k values

| batch | layer | flow N2 | flow CH4 | flow Ar | voltage V | n633 nm | k633 nm | k350 nm | n450 | k450 |
|---|---|---|---|---|---|---|---|---|---|---|
| 6 | $Si_vN_w$ | 4 | 0 | 32 | 540 | 4.19 | .5 | 2.43 | | |
| 12 | $Si_vN_w$ | 14 | 0 | 32 | 542 | 3.02 | .18 | 1.01 | | |
| 42 | SixCy | 0 | 4 | 32 | 557 | 3.97 | .24 | 2.33 | 4.35 | 1 |
| 45 | SixCy | 0 | 16 | 32 | 555 | 2.81 | .03 | 0.95 | 3.04 | 0.33 |

Table 2 shows measured and calculated results, the reflectance R and the transmittance T measurements were done by a Lambda 9 spectral photometer of Perkin Elmer on corning test substrates. From the R-T measurements, n and k values have been calculated. From the n and k values, the optimal thickness for highest possible signals $S_1$ and $S_2$ from both information carrying interfaces valid within the stack were calculated using the Film Star Program mentioned above. The optimal index giving the highest possible signals lies for SiC between n=3.97 and n=2.81. At n=3.13 and k=0.06 one gets signals of $S_1=S_2=32.2\%$, i.e. only 2,4% below the theoretical limit when Al is used as high reflecting back layer.

Table 3 shows the corresponding stoichiometry to the postulated limiting index of refractions useful for digital-video disk applications.

TABLE 2

R-T measurements in air and maximal possible signals from the info-layers $S_1$, $S_2$ for the corresponding optical constants n and k Red-laser results:

| batch | reflectance at 633 nm R % | transmittance at 633 nm T % | thickness measured dm nm | calculated optimal thickness dopt nm | signal of 1st info-layer S1 % | signal of 2nd info-layer S2 % |
|---|---|---|---|---|---|---|
| 6 | 62.2 | 23.2 | 35.1 | 15.2 | 25 | 25 |
| 12 | 47.8 | 41.8 | 51.3 | 48 | 28 | 28 |
| 42 | 63.4 | 28.1 | 39.1 | 18.5 | 29 | 29 |
| 45 | 46.3 | 51.5 | 57.4 | 56.3 | 26.2 | 40.8 |

Blue-laser results:

| batch | reflectance at 450 nm R % | transmittance at 450 nm T % | thickness measured dm nm | calculated optimal thickness dopt nm | signal of 1st info-layer S1 % | signal of 2nd info-layer S2 % |
|---|---|---|---|---|---|---|
| 42 | 38 | 36.4 | 39.1 | 9.2 | 21 | 21 |
| 45 | 28 | 40.5 | 57.4 | 34 | 25 | 25 |

TABLE 3

Stoichiometry of the batches benchmarking the limits (±10%) of useful refractive indices for DVDs

| batch | Si % | O % | N % | C % | H % | n633 nm | n450 nm |
|---|---|---|---|---|---|---|---|
| 6 | 78 | 5 | 11 | 2 | 4 | 4.19 | |
| 12 | 58.6 | 2 | 36.4 | 2 | 1 | 3.02 | |
| 42 | 70.4 | 7.8 | 0 | 8.7 | 13.1 | 3.97 | 4.35 |
| 45 | 49.4 | 4.2 | 0 | 23.8 | 22.6 | 2.81 | 3.04 |

Thus, as a band for the index of refraction, according to the present invention, we finally propose:

$2.59 \leq n_1 \leq 4.6$, thereby especially $2.8 \leq n_1 \leq 3.2$.

For the index of refraction k, we finally propose the following values:

$k_{300\ nm} \leq 3.0$ and/or $k_{350\ nm} \leq 2.7$ and/or $k_{600-700\ nm} \leq 0.5$, especially $\leq 0.1$, and/or $k_{450-500\ nm} \leq 1$.

Resuming the present invention, the following objects are resolved:

low cost manufacturing due to the fact that, exploiting the proposed stoichiometries, very thin layers may be used which drastically reduces manufacturing time;
matching of multiple reflected beams;
possibility to adjust signal levels to player capabilities;
possibility to adjust the signal levels reached to the thickness distribution performance realizable with a specific coating chamber;
improved adherence on chamber walls and masks for metallic-like layers to reduce flaking-off problems;

simpler process control in that it is possible to work near the metallic deposition mode. The closer one can work in a reactive process to the metallic mode, the smaller is the danger to abruptly and uncontrollably jump into reactive mode;

the use of nitrogen instead of propane or methane additionally reduces security measures.

realization of 25% signals from two information carrying interfaces even with a blue laser at 450 nm.

I claim:

1. Information carrier, comprising at least two solid material interfaces at which information is or may be applied and whereat the information is stored by local modulation of at least one solid material characteristic, from which characteristic reflection of electromagnetic radiation depends at said interfaces, further comprising at least one intermediate layer between said two solid material interfaces, which layer transmitting said radiation, said information being readable from at least one of said solid material interfaces by means of radiation of predetermined wavelength, wherein said intermediate layer comprises a dielectric layer system with at least one layer, said layer system having an optical thickness which, at least in a first approximation, is $m \cdot \lambda_o/4$, wherein m is integer, at least unity and is uneven and wherein $\lambda_o$ designates the wavelength of said radiation which is transmitted through said at least one dielectric layer of said dielectric layer system, wherein, departing from said m being integer, m may be reduced by an amount of up to 0.6 or increased by an amount of up to 0.2.

2. The information carrier according to claim 1, wherein said dielectric layer system at least predominantly consists of at least one of silicon carbide $Si_xC_y$ and of silicon nitride $Si_vN_w$.

3. The information carrier according to claim 1, wherein said locally modulated characteristic is the thickness of a solid material body defining at least one of said solid material interfaces.

4. The information carrier according to claim 1, wherein electromagnetic radiation for at least one of applying said information and of reading said information has a wavelength within the wavelength band of 400 nm $\leq \lambda_s \leq$ 800 nm.

5. The information carrier according to claim 4-, wherein said band is 630 nm $\leq \lambda_s \leq$ 655 nm.

6. The information carrier according to claim 4, wherein said band is 633 nm $\leq \lambda_s \leq$ 650 nm.

7. The information carrier according to claim 1, wherein reflection at at least one of said solid material interfaces is 20% to 40% (both limits included) for a predetermined wavelength of said radiation.

8. The information carrier according to claim 7, wherein said predetermined wavelength is within the 400 nm $\leq \lambda_s \leq$ 800 nm band.

9. The information carrier according to claim 7, said reflection being valid for a first wavelength at a first of said solid material interfaces and for a second wavelength at the second solid material interface, reflection of radiation of said second wavelength at said first solid material interface being significantly lower than of radiation of said first wavelength.

10. The information carrier according to claim 9, said first wavelength being approximately 635 nm or approximately 650 nm.

11. The information carrier according to claim 9, wherein said intermediate layer comprises at least one dielectric layer having an optical thickness which is an at least approximately uneven multiple of a quarter of one of said first and second wavelengths and is at least approximately an even multiple of a quarter of the other of said first and second wavelengths.

12. The information carrier according to claim 9, wherein said second wavelength is approximately 785 nm.

13. The information carrier according to claim 9, wherein said reflection of said radiation at said second wavelength and at said first solid material interface is 10% at most.

14. The information carrier according to claim 7, wherein said predetermined wavelength is within the 630 nm $\leq \lambda_s \leq$ 655 nm band.

15. The information carrier according to claim 7, wherein said predetermined wavelength is within the 633 nm $\leq \lambda_s \leq$ 650 nm band.

16. The information carrier according to claim 1, wherein at least one is valid:

a) the index of refraction $n_1$ of said intermediate layer is:

2.59 $\leq n_1 \leq$ 4.6, b) the extinction coefficient k of said intermediate layer is at least one of:

$k_{300\,nm} \leq 3.0$;.

17. The information carrier according to claim 16, wherein $k_{300\,nm} \leq 1.5$.

18. The information carrier according to claim 16, wherein $k_{350\,nm} \leq 2.7$.

19. The information carrier according to claim 16, wherein
$k_{600-700\,nm} \leq 0.5$.

20. The information carrier according to claim 1, wherein said intermediate layer comprises a spacer layer.

21. The information carrier according to claim 20, wherein said spacer layer consists of at least one of a lacquer and of a glue.

22. The information carrier according to claim 1, wherein said dielectric layer consists at least predominantly of at least one of the materials of the group ZrN, HfN, TiN.

23. The information carrier according to claim 22, wherein said dielectric layer at least predominantly consists of ZrN.

24. The information carrier according to claim 1, wherein one of said solid material interfaces is formed between said intermediate layer and a plastic material or between said intermediate layer and a spacer layer or between said intermediate layer and a high reflecting cover layer.

25. The information carrier according to claim 24, wherein at least one of the following is valid:

said plastic material is one of polycarbonate and of PMMA, said spacer layer is at least predominantly of at least one of lacquer and glue, said high reflecting cover layer is at least predominantly of at least one of Al, Au, Ag.

26. The information carrier according to claim 25, said high reflecting cover layer consisting at least predominantly of Al.

27. The information carrier according to claim 1, wherein one of said solid material interfaces is formed at a lacquer surface.

28. The information carrier according to claim 27, wherein said lacquer is hardenable by means of ultra-violet radiation.

29. The information carrier according to claim 1, wherein said intermediate layer comprises at least one semiconductor doping material.

30. The information carrier according to claim 29, wherein said doping material is at least one of Boron and Phosphor.

31. The information carrier according to claim 1, wherein said intermediate layer comprises C and forms at least one of said solid material interfaces with a further material which contains C as well.

32. The information carrier according to claim 1, wherein radiation in the blue spectral range of 400 nm $\leq \lambda_s \leq$ 500 nm performs at least one of reading and writing of said information.

33. The information carrier according to claim 1, wherein said intermediate layer comprises at least one of $Si_xC_y$ and of $Si_xC_yH_z$, wherein $x \geq y$.

34. The information carrier according to claim 1, wherein said intermediate layer comprises at least one of $Si_vN_w$ and $Si_vN_wH_u$, wherein $v \geq w$.

35. The information carrier according to claim 1, wherein said intermediate layer comprises at least one of $Si_xC_y$ and $Si_xC_yH_z$ and wherein $x \geq 1.2y$.

36. The information carrier according to claim 35, wherein $x \geq 2y$.

37. The information carrier according to claim 1, wherein said intermediate layer comprises at least one of $Si_vN_w$ and of $Si_vN_wH_u$ and wherein $v \geq 1.2w$.

38. The information carrier according to claim 37, wherein $v \geq 1.6w$.

39. The information carrier according to claim 1, wherein said intermediate layer comprises $Si_xC_yH_z$ and wherein there is valid:

$x \leq 0.8$, $y \geq 0.05$ and $z \geq 0.1$.

40. The information carrier according to claim 39, wherein there is valid:

$x \leq 0.52$, $y \geq 0.1$, $z \geq 0.2$.

41. The information carrier according to claim 1, wherein said intermediate layer comprises at least one of $Si_vN_wH_u$ and $Si_vN_w$ and wherein there is valid:

$v \leq 0.8$, $w \geq 0.05$.

42. The information carrier according to claim 41, wherein there is valid:

$w \geq 0.1$.

43. The information carrier according to claim 1, wherein said intermediate layer comprises at least one of $Si_xC_y$ and $Si_xC_yH_z$ and wherein there is valid:

$\{0.445:0.262\} \leq \{x:y\} \leq \{0.775:0.078\}$.

44. The information carrier according to claim 1, wherein said intermediate layer comprises at least one of $Si_xC_y$ and $Si_xC_yH_z$ and wherein there is valid:

$\{0.445:0.249\} \leq \{x:z\} \leq \{0.775:0.118\}$.

45. The information carrier according to claim 1, wherein said intermediate layer comprises at least one of $Si_xC_y$ and $Si_xC_yH_z$ and wherein there is valid:

$\{0.078:0.249\} \leq \{y:z\} \leq \{0.262:0.118\}$.

46. The information carrier according to claim 1, wherein said intermediate layer at least predominantly consists of $Si_xC_yH_z$ and wherein there is valid:

$x:y:z=0.704$ ($\pm 10\%$):$0.087$ ($\pm 10\%$):$0.131$ ($\pm 10\%$), wherein $\pm 10\%$ indicates the statistic dispersion of multiple measurements of the values.

47. The information carrier according to claim 1, wherein said intermediate layer at least predominantly consists of $Si_xC_yH_z$ and wherein there is valid:

$x:y:z=0.494$ ($\pm 10\%$):$0.238$ ($\pm 10\%$):$0.226$ ($\pm 10\%$), wherein $\pm 10\%$ indicates the statistic dispersion of multiple measurements of said values.

48. The information carrier according to claim 1, wherein said intermediate layer comprises at least one of $Si_vN_w$ and $Si_vN_wH_u$ and wherein there is valid:

$\{0.527:0.401\} \leq \{v:w\} \leq \{0.858:0.099\}$.

49. The information carrier according to claim 1, wherein said intermediate layer comprises at least one of $Si_vN_w$ and $Si_vN_wH_u$ and wherein there is valid:

$\{0.527:0.044\} \leq \{v:u\} \leq \{0.858:0.009\}$.

50. The information carrier according to claim 1, wherein said intermediate layer comprises at least one of $Si_vN_w$ and $Si_vN_wH_u$ and wherein there is valid:
$\{0.099:0.044\} \leq \{v:u\} \leq \{0.401:0.009\}$.

51. The information carrier according to claim 1, wherein said intermediate layer comprises at least one of $Si_vN_w$ and $Si_vN_wH_u$ and wherein there is valid:
$v:w=0.78$ ($\pm 10\%$):$0.11$ ($\pm 10\%$), wherein $\pm 10\%$ indicates statistic dispersion of multiple measurements.

52. The information carrier according to claim 1, wherein said intermediate layer comprises at least one of $Si_vN_w$ and $Si_vN_wH_u$ and wherein there is valid:

$v:w=0.586$ ($\pm 10\%$):$0.364$ ($\pm 10\%$), wherein $\pm 10\%$ indicates statistic dispersion of multiple measurements.

53. The information carrier according to claim 1, wherein adherence of said intermediate layer on an adjacent solid material of the carrier withstands at least one of the tests according to MIL-M-13508C and of MIL-C-00675B as defined in H. Pulker, "Coatings on Glass", Elsevier, 1984, p. 358.

54. The information carrier according to claim 1, wherein at least three of said solid material interfaces are provided on one side of a carrier substrate.

55. The information carrier according to claim 1, with an information storage capacity per side of a carrier substrate of at least 11 GByte at a diameter of a circular carrier of 120 mm.

56. The information carrier according to claim 55, said storage capacity being 13 GByte.

57. The information carrier according to claim 1, wherein said intermediate layer predominantly consisting of at least one of silicon carbide $Si_xC_y$ and of silicon nitride $Si_vN_w$.

\* \* \* \* \*